United States Patent
Park et al.

(10) Patent No.: US 7,205,096 B2
(45) Date of Patent: Apr. 17, 2007

(54) METHOD FOR FORMING METAL PATTERN BY USING METAL NANOCRYSTALS

(75) Inventors: Jong Jin Park, Gyeonggi-Do (KR); Sang Yeol Kim, Gyeonggi-Do (KR); Tae Woo Lee, Seoul (KR); Lyong Sun Pu, Gyeonggi-Do (KR)

(73) Assignee: Samsung Electronics Co., Ltd., Suwon-Gyeonggi-do (KR)

( * ) Notice: Subject to any disclaimer, the term of this patent is extended or adjusted under 35 U.S.C. 154(b) by 181 days.

(21) Appl. No.: 11/117,431

(22) Filed: Apr. 29, 2005

(65) Prior Publication Data

US 2006/0110686 A1 May 25, 2006

(30) Foreign Application Priority Data

Nov. 23, 2004 (KR) .................. 10-2004-0096321

(51) Int. Cl.
C23C 18/30 (2006.01)

(52) U.S. Cl. .............. 430/311; 430/315; 430/319; 430/321; 430/324; 427/96.3; 427/123; 427/304; 427/404; 427/553; 428/457

(58) Field of Classification Search .............. None
See application file for complete search history.

(56) References Cited

U.S. PATENT DOCUMENTS

2002/0004180 A1* 1/2002 Hotta et al. .................. 430/311
2003/0143411 A1* 7/2003 Nakagawa .................. 428/458
2005/0064108 A1* 3/2005 Kano et al. .................. 427/553

FOREIGN PATENT DOCUMENTS

| JP | 5-16281 | 1/1993 |
| JP | 11-119675 | 4/1999 |
| JP | 2003-109435 | 4/2003 |

* cited by examiner

*Primary Examiner*—John A. McPherson
(74) *Attorney, Agent, or Firm*—Buchanan Ingersoll & Rooney PC

(57) ABSTRACT

Disclosed herein is a method for forming a metal pattern by using metal nanocrystals. The method comprises the steps of: (i) coating a photosensitive compound having a substituent, which is converted into a free carboxyl group by light exposure, on a substrate to form a photosensitive film; (ii) selectively exposing the photosensitive film to light in the presence of a photoacid generator to form a latent pattern for crystal growth having a free carboxyl group; and (iii) treating the latent pattern for crystal growth with a nanometallic solution in which metal nanocrystals can be formed to grow the metal nanocrystals on the latent pattern. According to the method, a metal wiring pattern can be formed in a cost-effective and relatively simple manner. Further, the metal pattern formed by the method can be useful in the manufacture of an electromagnetic interference filter for flat panel display devices or an electrode, and can thus be applied to devices, e.g., organic light-emitting devices (OLED) and organic thin-film transistors (OTFT).

14 Claims, 1 Drawing Sheet

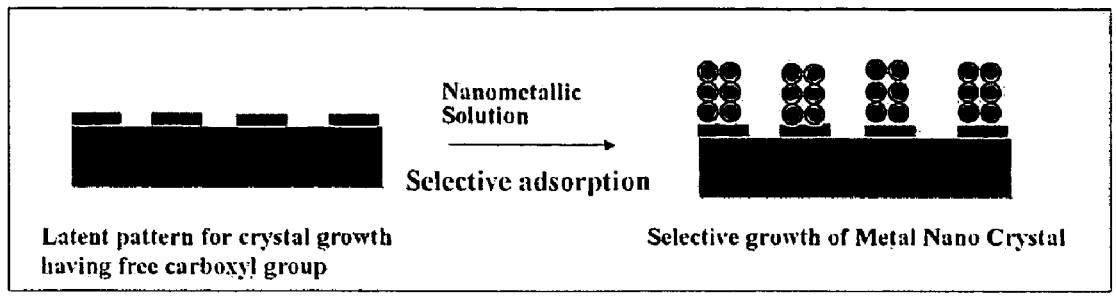

FIG. 1

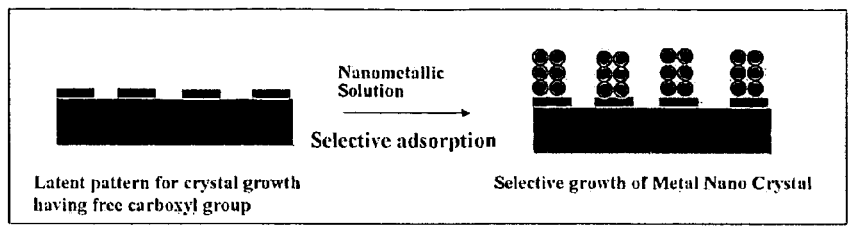

Latent pattern for crystal growth having free carboxyl group → Nanometallic Solution / Selective adsorption → Selective growth of Metal Nano Crystal

FIG. 2

| Summary of metals usable for metal wiring in the Periodic Table in the Elements ||||||||||||
|---|---|---|---|---|---|---|---|---|---|---|---|
| Ia | IIa | | | | | | | | | IIIa | IVa |
| 3 Li 3.55 | 4 Be 4.0 | Atomic Number / Atomic symbol / Resistivity (1Ωcm) ||| Metals currently used in LCD manufacturing Industry |||| | 5 B 1E12 | 6 C 1E19 |
| | | ||| Contact metal candidates |||| | | |
| 11 Na 4.2 | 12 Mg 4.46 | ||| Low-resistivity metal candidates |||| | 13 Al 2.65 | 14 Si 1E95 |
| | | IIIb | IVb | Vb | VIb | VIIb | VIII ||| Ib | IIb |
| 19 K 6.15 | 20 Ca 3.43 | 21 Sc 51.0 | 22 Ti 42.6 | 23 V 24.8 | 24 Cr 12.7 | 25 Mn 4.35 | 26 Fe 9.71 | 27 Co 6.24 | 28 Ni 6.84 | 29 Cu 5.1 | 30 Zn 5.92 |
| 31 Ga 27 | 32 Ge 1E07 | | | | | | | | | | |
| 37 Rb 12.5 | 38 Sr 23.0 | 39 Y 57.0 | 40 Zr 42.1 | 41 Nb 18.5 | 42 Mo 5.2 | 43 Tc 22.6 | 44 Ru 7.6 | 45 Rh 4.51 | 46 Pd 10.8 | 47 Ag 3.0 | 48 Cd 6.83 |
| 49 In 8.37 | 50 Sn 11.0 | | | | | | | | | | |
| 55 Cs 20.0 | 56 Ba 50 | 57 La 79.0 | 72 Hf 35.1 | 73 Ta 12.0 | 74 W 5.65 | 75 Re 12.3 | 76 Os 8.12 | 77 Ir 5.3 | 78 Pt 10.6 | 79 Au 7.15 | 80 Hg 91.1 |
| 81 Tl 18.0 | 82 Pb 20.65 | | | | | | | | | | |

METHOD FOR FORMING METAL PATTERN BY USING METAL NANOCRYSTALS

Priority is claimed under 35 U.S.C. § 119 to Application No. 2004-96321, filed in the Republic of Korea on Nov. 23, 2004, herein incorporated by reference.

BACKGROUND OF THE INVENTION

1) Field of the Invention

The present invention relates to a method for forming a metal pattern by using metal nanocrystals, and more particularly to a method for forming a metal pattern by use of a photosensitive compound having a substituent, which is converted into a free carboxyl group by light exposure.

2) Description of the Related Art

With increasing demand for large display area and high resolution of flat panel displays, e.g., liquid crystal displays (LCD), plasma display panels (PDP), and inorganic and organic light-emitting displays (OLED), metal wirings are considerably extended in length and the design rule for the increased aperture ratio is decreased. For these reasons, there arise many problems, such as a significant increase in wiring resistance and capacitance, and signal delay and distortion. Under this circumstance, development of a process for forming a highly conductive metal wiring is recognized to be absolutely essential in developing high resolution and large area flat panel display devices. The use of low resistivity aluminum (Al) as a wiring material has been actively discussed in large-sized LCD. In this case, AlNd, one type of Al-alloy, is used to prevent the problem of wiring non-uniformity, for example, hillocks, due to a substance migration caused when pure Al is used. Meanwhile, because of an increase in resistivity caused by the addition of an alloy and an increase in contact resistance by a high reactivity with $\alpha$-Si or ITO, a multilayer structure, such as Cr/AlNd/Cr, is required when an Al-alloy is used as a source/drain electrode material.

However, complicated processes are required to form the multilayer structure, and there is thus a limitation in productivity. Metals usable to form metal wirings are presented in the Periodic Table shown in FIG. 2.

Al-alloys are mainly used, but copper (Cu) and silver (Ag) have been the focus of intense interest lately due to their low resistivity and good contact properties on an amorphous silicon layer. However, when copper or silver is used as a gate electrode, it exhibits poor adhesion to an underlying substrate and thus the metal wiring to strip off during subsequent processes. Further, when copper or silver is used as a source or drain electrode, copper atoms are diffused into an amorphous silicon layer at 200° C. or higher or electromigration takes place due to electric drive, causing deterioration in wiring and device properties. Accordingly, in order to use copper or silver as a low-resistivity wiring material, there is a need to form an additional metal layer having good adhesion to a substrate and a low contact resistance in the lower portion and/or the upper portion of the wiring material, leading to a multilayer metal pattern.

In order to satisfy the need to form a large display area at a relatively low cost, it is thus necessary to develop techniques for replacing conventional wiring materials with new materials and forming a multilayer metal wiring in a relatively simple manner.

A method for forming a metal pattern by using a photoresist is currently used. However, since this method involves complex processes, including metal sputtering, photoresist patterning by light exposure and developing, and etching, it is not suitable for use in the formation of a multilayer metal pattern. In addition, technical difficulties and increased manufacturing costs associated with the development of vacuum thin-film deposition equipment according to increasing size of glass substrates for forming large-area patterns, are not trivial.

In this connection, Japanese Patent Laid-open No. Hei 11-119675 discloses a process for producing an electromagnetic wave shielding plate arranged on the front surface of a display wherein a mesh made of a metal thin film is laminated on one side of a transparent substrate. This process is suitable for mass production of an electromagnetic wave shielding plate with superior electromagnetic wave shielding properties and see-through properties. Specifically, the process comprises the steps of (a) forming (masking) a plating resist mask for plating a mesh on a continuous hoop-shaped substrate having plating stripping properties, (b) electrodepositing a metal thin-film layer made of a particular material for mesh formation on portions of the substrate surface exposed from the resist mask, and (c) adhering and transferring the electrodeposited metal thin-film layer to a surface of the transparent substrate for the electromagnetic wave shielding plate using an adhesive. The process is disadvantageous in terms of complicated production steps.

Japanese Patent Laid-open No. Hei 5-16281 discloses a light-transmitting electromagnetic wave shielding material comprising a substrate, a hydrophilic transparent resin layer laminated on the substrate and an electroless plating layer laminated on a pattern of the resin layer wherein a black pattern section is formed between the electroless plating layer and the hydrophilic transparent resin layer. However, the shielding material suffers from the drawback that photoresist and etching processes are accompanied.

Japanese Patent Laid-open No. 2003-109435 discloses a method for producing a transparent conductive film comprising forming a metallic ultrafine particle catalyst layer having a prescribed pattern on a transparent substrate, and forming a metal layer on the catalyst layer wherein the ratio of the average opening diameter to the average line width of the pattern is above 7:1. However, a drawback of this method is the use of the ultrafine catalyst.

There is thus a need in the art for a method that enables the formation of a metal pattern in a cost-effective and simple manner.

SUMMARY OF THE INVENTION

As a result of intensive research in view of the above-mentioned problems, the present inventors have found that a single-layer or multilayer metal pattern including a highly electrically conductive metal can be formed in a simple manner by coating a carboxyl compound protected with a tert-butyloxy group, which is converted to a carboxylic compound by light exposure, on a substrate to form a photosensitive film responding to light, selectively exposing the photosensitive film to light in the presence of a photoacid generator to form a latent pattern for crystal growth having the deprotected free carboxyl group, and selectively adsorbing desired metal nanocrystals on the latent pattern to grow the metal nanocrystals. In addition, the present inventors have found that the metal pattern thus formed is superior in metal wiring properties. Embodiments of the present invention has been achieved based on these findings.

Therefore, it is an object of embodiments of the present invention to provide a method for forming a single layer or multilayer metal pattern by simple photolithography in a rapid and efficient manner without the necessity of a metal thin-film formation process requiring high vacuum or high temperature conditions, a light-exposure process for forming a minute pattern, or a subsequent etching process.

It is another object of embodiments of the present invention to provide a flat panel display device or electrode manufactured using a metal pattern formed by the method.

In accordance with one aspect of the present invention, there is provided a method for forming a metal pattern comprising the steps of: (i) coating a photosensitive compound having a substituent, which is converted into a free carboxyl group by light exposure, on a substrate to form a photosensitive film; (ii) selectively exposing the photosensitive film to light in the presence of a photoacid generator to form a latent pattern for crystal growth having a free carboxyl group; and (iii) treating the latent pattern for crystal growth with a nanometallic solution in which metal nanocrystals can be formed to grow the metal nanocrystals on the latent pattern.

In accordance with another aspect of the present invention, there is provided a metal pattern formed by the method.

In accordance with another aspect of the present invention, there is provided a flat panel display device comprising the metal pattern as a metal wiring.

In accordance with still another aspect of the present invention, there is provided an electrode comprising the metal pattern.

BRIEF DESCRIPTION OF THE DRAWINGS

The above and other objects, features and other advantages of the present invention will be more clearly understood from the following detailed description taken in conjunction with the accompanying drawings, in which:

FIG. 1 is an exemplary diagram schematically showing a method for forming a metal pattern according to embodiments of the present invention.

FIG. 2 is a Periodic Table of metals usable to form metal wirings.

DESCRIPTION OF THE PREFERRED EMBODIMENTS

Hereinafter, the present invention will be explained in more detail, based on the respective steps.

Step (i):

First, a photosensitive compound responding to light is coated on a substrate to form a transparent amorphous photosensitive film on the substrate.

The term "photosensitive compound" as used herein refers to a compound whose characteristics are considerably changed upon light exposure. For example, the photosensitive compound can be a compound having a substituent in which a carboxyl group capable of reacting with metal nanocrystals is protected with a tert-butyloxy group before light exposure, but the substituent of the photosensitive compound is deprotected by a strong acid generated from a photoacid generator upon being exposed to light, e.g., UV light, to form a free carboxyl group.

The photosensitive compound used in the method of the present invention is represented by Formula 1 below:

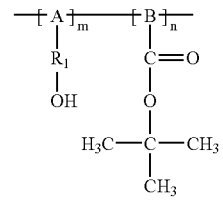

Formula 1 wherein

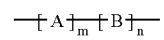

represents the backbone chain of a copolymer constituting the photosensitive compound; A and B, which may be identical to or different from each other, are polymer units selected from the group consisting of polyethylenes, polyesters, polycarbonates, polyvinylalcohols, polyvinylbutyrals, polyacetals, polyarylates, polyamides, polyamideimides, polyetherimides, polyphenyleneethers, polyphenylenesulfides, polyethersulfones, polyetherketones, polyphthalamides, polyethernitriles, polybenzimidazoles, polycarbodiimides, polysiloxanes, polymethylmethacrylates, polymethacrylamides, nitrile rubbers, acrylic rubbers, polyethylenetetrafluorides, epoxy resins, phenol resins, melamine resins, urea resins, cellulose resins, polybutenes, polypentenes, ethylene-propylene copolymers, ethylene-butene-diene copolymers, polybutadienes, polyisoprenes, ethylene-propylene-diene copolymers, butyl rubbers, polymethylpentenes, polystyrenes, styrene-butadiene copolymers, hydrogenated styrene-butadiene copolymers, polystyrene-hydrogenated polyisoprenes, and hydrogenated polybutadienes; $R_1$ is a $C_{2\sim6}$ alkylene group, cyclohexyl, or phenyl; the sum of m and n is 1; and n is between 0.1 and 0.9.

The tert-butyloxy group in the substituent bonded to the polymer unit B in the backbone chain of the photosensitive compound is a carbonyl-protecting substituent. The tert-butyloxy group is separated from the compound and a free carboxyl group is formed in the subsequent light exposure step. The group $R_1OH$ bonded to the adjacent backbone chain A is not affected by light exposure and thus no carboxyl group is formed before and after the subsequent light exposure step. In addition, since the group $R_1OH$ enhances a hydrogen bond, it can increase adhesion to the substrate.

The photosensitive compound is dissolved in an appropriate solvent, such as isopropyl alcohol, propylene glycol monomethylethyl acetate, dimethylformamide (DMF), 4-hydroxy-4-methyl-2-pentanone, ethylene glycol monoethyl ether, 2-methoxyethanol, methoxypropylacetate, ethyl-3-ethoxypropionate, cyclohexanone, toluene, or xylene, and then the solution is coated on the substrate by spin coating, spray coating, screen printing, dip coating, or the like.

Examples of substrates usable for the method of the present invention include, but are not especially limited to, transparent plastic substrates and glass materials. As examples of transparent plastic substrates, acrylic resins, polyesters, polycarbonates, polyethylenes, polyethersulfones, olefin maleimide copolymers, norbornene-based resins, etc. can be mentioned. In the case where excellent heat resistance is required, olefin maleimide copolymers and norbornene-based resins are preferred. Otherwise, it is preferred to use polyester films, acrylic resins, and the like.

A 30~1,000 nm thick coating layer is formed by any one of the coating techniques. After coating, the coating layer is heated on a hot plate or in a convection oven at a temperature not higher than 120° C. for 15~20 minutes to form the desired photosensitive film.

Step (ii):

In this step, the photosensitive film is selectively exposed to light to deprotect the carboxyl group and to form a latent pattern for crystal growth containing the free carboxyl group to which metal nanocrystals can be bonded. Exposure atmospheres and exposure dose are not especially limited, and can be properly selected according to the kind of photosensitive compounds used. Preferably, the photosensitive film is exposed to light at 360 nm for 5~30 minutes. The photoacid generator is a polymer capable of generating an acid upon light irradiation during light exposure. As non-ionic photoacid generators, there may be mentioned, for example, halogenides capable of generating HX, and onium salts as sulfone compounds capable of generating sulfonic acid. As ionic photoacid generators, there can be used, for example, ammonium compounds, diazonium compounds, iodonium compounds, sulfonium compounds, phosphonium compounds, onium polymer compounds, selenium salt compounds, and arsenium compounds. To effectively expose the carboxyl group of the desired latent pattern, it is preferred to use the onium salt of Formula 2 below:

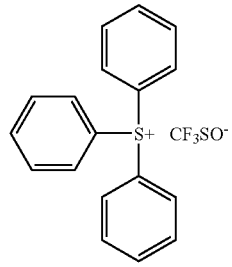

Formula 2

In this step, the tert-butyloxy group is separated from the photosensitive compound and a carboxyl group is formed, where the carboxyl group reacts with metal nanocrystals in the subsequent treatment with a nanometallic solution, acting as a latent pattern for crystal growth.

For better sharpness of the final metal pattern, exemplary embodiments of the method of the present invention may further comprise the step of developing the latent pattern after the light exposure step.

Step (iii):

The treatment with a nanometallic solution can be varied depending on the kind of metals to be treated. The metals constituting each metal layer may be identical to or different from each other. The thickness of the metal layers can be properly controlled. As shown in FIG. 1, metal nanocrystals are bonded to the carboxyl group deprotected in step ii). To this end, the substrate on which the latent pattern for crystal growth having a free carboxyl group is formed, is dipped in the nanometallic solution in which metal nanocrystals with a size of 5~10 nm can be formed, thereby forming the final metal pattern.

The nanometallic solution generally contains 1) a metal salt, 2) a reducing agent, 3) a complexing agent, 4) a pH-adjusting agent, 5) a pH buffer, and 6) a modifying agent. At this time, control of the metal salt and the reducing agent is necessary to prepare an optimum composition for forming metal nanocrystals. The metal salt of 1) serves to supply nano-sized metal crystals to the substrate. Examples of the metal salt include chlorides, nitrates, and acetates of the corresponding metal. Preferably, $AgNO_3$ solution is used for supply of silver nanocrystals, and $Cu(N_2H_3COO)_2H_2O$ or $CuCl_2$ solution is used for supply of copper nanocrystals, and $AlCl_3$ solution is used for supply of aluminum nanocrystals. The reducing agent of 2) acts to reduce metal ions presented on the substrate. Specific examples of the reducing agent include $NH_3$, $NH_4OH$, and $NaBH_4$. The complexing agent of 3) functions to prevent the precipitation of hydroxides in an alkaline solution and to control the concentration of free metal ions, thereby preventing the decomposition of metal salts and adjusting the plating speed. Specific examples of the complexing agent include ammonia solution, acetic acid, guanylic acid, tartaric acid salt, chelating agents (e.g., EDTA and $C_4H_4O_6KNa$), and organic amine compounds. Chelating agents (e.g., $C_4H_4O_6KNa$) are preferred. The pH-adjusting agent of 4) plays a roll in adjusting the pH of the nanometallic solution, and is an acidic or basic compound. The pH buffer of 5) inhibits the sudden change in the pH of the nanometallic solution, and is selected from organic acids and weakly acidic inorganic compounds. The modifying agent of 6) is a compound capable of improving coating and planarization characteristics. Specific examples of the modifying agent include common surfactants and adsorptive substances capable of adsorbing components interfering with the crystal growth.

For example, when the latent pattern for crystal growth having a free carboxyl group is dipped in the solution, the following Reaction 1 takes place:

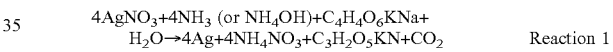

$4AgNO_3+4NH_3$ (or $NH_4OH$)+$C_4H_4O_6KNa$+
$H_2O \rightarrow 4Ag+4NH_4NO_3+C_3H_2O_5KN+CO_2$   Reaction 1

During the reaction, metal crystals having a size of 5~10 nm are precipitated and grown on the latent pattern.

The metal pattern thus formed can be useful in the manufacture of a metal wiring or an electromagnetic interference filter for flat panel display devices, such as LCDs, PDPs and ELDs, or an electrode for organic thin-film transistors.

Embodiments of the present invention will now be described in more detail with reference to the following preferred examples. However, these examples are given for the purpose of illustration and are not to be construed as limiting the scope of the invention.

EXAMPLE 1

1–1) Formation of Latent Pattern for Crystal Growth Having Carboxyl Group 1 g of poly(t-butylmethacrylate-co-2-hydroxyethylmethacrylate) copolymer (Formula 3) was dissolved in 10 g of propylene glycol monomethyl ethyl acetate (PGMEA) as a solvent, and then the solution was spin-coated on a transparent polyester film. The coated film was dried at 100° C. for 10 minutes to prepare a photosensitive film having a thickness of about 100 nm. UV light was irradiated from a UV exposure system (Oriel, U.S.A) to the photosensitive film through a photomask on which a minute pattern was formed in the presence of the onium salt of Formula 2 as a photoacid generator. The exposed film was subjected to post exposure baking by heating to 120° C. for 10 minutes, and developed with pure water to form a latent pattern for crystal growth having an exposed free carboxyl group, on which a metal pattern could be formed.

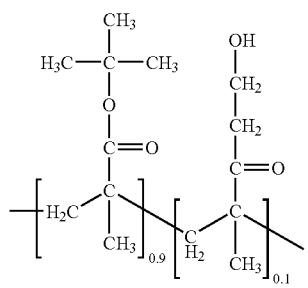

Formula 3

1-2) Formation of Metal Pattern Consisting of Nanocrystals;

The substrate on which the latent pattern was formed was dipped in a composition for metal crystal growth consisting of 16.9 g of $AgNO_3$, 12.5 g of $NH_4OH$, 1.2 g of $C_4H_4O_6KNa$ and 200 g of $H_2O$ for 10 seconds to grow crystals of a patterned metal wiring. The above procedure was repeated several times to form a wiring pattern of silver. The conductivity and the electron micrograph of the patterned substrate are shown in Table 2, respectively. The conductivity was measured using a 4-point probe.

EXAMPLE 2

The substrate prepared in Example 1-1) was dipped in a composition for metal crystal growth consisting of 16.9 g of $AgNO_3$, 12.5 g of $NH_4OH$, 1.2 g of $C_4H_4O_6KNa$ and 20 g of $H_2O$ for 10 minutes to grow crystals of a patterned metal wiring. The above procedure was repeated once to form a wiring pattern of silver. The conductivity of the patterned substrate is shown in Table 2. The conductivity was measured by the same method as in Example 1.

EXAMPLE 3

The substrate prepared in Example 1-1) was dipped in a composition for metal crystal growth consisting of 16.9 g of $AgNO_3$, 12.5 g of $NH_4OH$, 1.2 g of $C_4H_4O_6KNa$ and 40 g of $H_2O$ for one minute to grow crystals of a patterned metal wiring. The above procedure was repeated three times to form a wiring pattern of silver. The conductivity of the patterned substrate is shown in Table 2. The conductivity was measured by the same method as in Example 1.

EXAMPLE 4

The substrate prepared in Example 1-1) was dipped in a composition for metal crystal growth consisting of 16.9 g of $AgNO_3$, 12.5 g of $NH_4OH$, 1.2 g of $C_4H_4O_6KNa$ and 60 g of $H_2O$ for one minute to grow crystals of a patterned metal wiring. The above procedure was repeated three times to form a wiring pattern of silver. The conductivity of the patterned substrate is shown in Table 2. The conductivity was measured by the same method as in Example 1.

TABLE 2

| Example No. | Conductivity (Siemens/cm) | Thickness of metal layer |
|---|---|---|
| Example 1 | 1.2~1.5 S/cm | 100 nm |
| Example 2 | 28,174 S/cm | 300 nm |
| Example 3 | 52 S/cm | 170 nm |
| Example 4 | 23 S/cm | 160 nm |

As apparent from the above description, according to the method of the present invention, single layer and multilayer metal patterns can be formed by forming a photosensitive compound thin film by means of a simple coating process instead of conventional physical deposition, followed by light exposure and simple treatment with a nanometallic solution. Accordingly, embodiments of the present invention can provide a method for effectively forming a single layer and multilayer metal wiring pattern having a high conductivity in a rapid and efficient manner without the necessity of a sputtering process requiring high vacuum conditions, a photopatterning process using a photosensitive resin, or an etching process. The low resistance metal pattern formed by the method of embodiments of the present invention can be advantageously applied to various flat panel display devices and electrodes.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a metal pattern comprising the steps of:
   (i) coating a photosensitive compound represented by Formula 1 below on a substrate to form a photosensitive film;
   (ii) selectively exposing the photosensitive film to light in the presence of a photoacid generator to form a latent pattern for crystal growth having a free carboxyl group; and
   (iii) treating the latent pattern for crystal growth with a nanometallic solution in which metal nanocrystals are formed to grow the metal nanocrystals on the latent pattern:

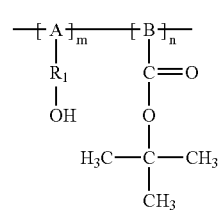

(1)

wherein

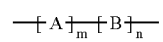

represents the backbone chain of a copolymer constituting the photosensitive compound; A and B, which is identical to or different from each other, are polymer units selected from the group consisting of polyethylenes, polyesters, polycarbonates, polyvinylalcohols, polyvinylbutyrals, polyacetals, polyarylates, polyamides, polyamideimides, polyetherimides, polyphenyleneethers, polyphenylenesulfides, polyethersulfones, polyetherketones, polyphthalamides, polyethernitriles, polybenzimidazoles, polycarbodiimides, polysiloxanes, polymethylmethacrylates, polymethacrylamides, nitrile rubbers, acrylic rubbers, polyethylenetetrafluorides, epoxy resins, phenol resins, melamine resins, urea resins, cellulose resins, polybutenes, polypentenes, ethylene-propylene copolymers, ethylene-butenediene copolymers, polybutadienes, polyisoprenes, ethylene-propylenediene copolymers, butyl rubbers, polymethylpentenes, polystyrenes, styrene-butadiene copolymers, hydrogenated styrene-butadien copolymers, polystyrene-hydrogenated polyisoprenes, and hydrogenated polybutadienes; $R_1$ is a $C_{2-6}$ alkylene group, cyclohexyl, or phenyl; the sum of m and n is 1; and n is between 0.1 and 0.9.

2. The method according to claim 1, wherein in step (i), the photosensitive compound is dissolved in at least one solvent selected from the group consisting of isopropyl alcohol, propylene glycol monomethylethyl acetate, dimethylformamide (DMF), 4-hydroxy-4-methyl-2-pentanone, ethylene glycol monoethyl ether, 2-methoxyethanol, methoxypropylacetate, ethyl-3-ethoxypropionate, cyclohexanone, toluene, and xylene, before coating.

3. The method according to claim 1, wherein the coating in step (i) is carried out by a coating process selected from the group consisting of spin coating, spray coating, screen printing, and dip coating.

4. The method according to claim 1, wherein in step (i), the photosensitive film is formed by heating to 90~120° C. for 15~20 minutes.

5. The method according to claim 1, wherein in step (i), the photosensitive film has a thickness of 30~1,000 nm.

6. The method according to claim 1, wherein the light exposure in step (ii) is carried out at 360 nm for 5~30 minutes.

7. The method according to claim 1, wherein in step (ii), the photoacid generator is at least one compound selected from the group consisting of halogenides, onium compounds, sulfonic acid compounds, ammonium compounds, diazonium compounds, iodonium compounds, sulfonium compounds, phosphonium compounds, onium polymer compounds, selenium salt compounds, and arsenium compounds.

8. The method according to claim 1, wherein in step (iii), the nanometallic solution contains a metal salt, a reducing agent, and) a completing agent.

9. The method according to claim 8, wherein the metal salt is $AgNO_3$, $Cu(N_2H_3COO)_2H_2O$, $CuCl_2$, or $AlCl_3$.

10. The method according to claim 8, wherein the reducing agent is $NH_3$, $NH_4OH$, or $NaBH_4$.

11. The method according to claim 8, wherein the complexing agent is ammonia solution, acetic acid, guanylic acid, tartaric acid salt, EDTA, or $C_4H_4O_6KNa$.

12. A metal pattern formed by the method according to claim 1.

13. A flat panel display device comprising the metal pattern according to claim 12 as a metal wiring.

14. An electrode comprising the metal pattern formed by the method according to claim 1.

* * * * *